United States Patent

Smolley

[11] Patent Number: 5,977,627
[45] Date of Patent: Nov. 2, 1999

[54] PACKAGING CONSTRUCTION FOR VERY LARGE SCALE INTEGRATED-CIRCUIT CHIPS

[75] Inventor: Robert Smolley, Portuguese Bend, Calif.

[73] Assignee: TRW Inc., Redondo Beach, Calif.

[21] Appl. No.: 07/303,870

[22] Filed: Jan. 30, 1989

Related U.S. Application Data

[63] Continuation-in-part of application No. 06/944,124, Dec. 22, 1986, abandoned.

[51] Int. Cl.$^6$ .......................... H01L 23/02; H01L 21/44; H01L 21/50
[52] U.S. Cl. ..................... 257/709; 438/106; 438/121; 438/122; 438/125; 257/702; 257/784
[58] Field of Search .................... 357/74, 67–70, 357/72, 73; 371/22.3, 27; 364/490; 365/52, 72; 361/398; 257/678, 687, 690, 699, 701, 702, 709, 774, 784; 438/106, 121, 122, 125

[56] References Cited

U.S. PATENT DOCUMENTS

| | | | |
|---|---|---|---|
| 3,769,560 | 10/1973 | Miyake et al. | 257/695 |
| 4,225,900 | 9/1980 | Cicci et al. | 361/739 |
| 4,491,622 | 1/1985 | Butt | 428/632 |
| 4,535,219 | 8/1985 | Sliwa, Jr. | 219/121 LC |
| 4,563,541 | 1/1986 | Lebailly et al. | 174/52.4 |

*Primary Examiner*—John B. Sotomayor
*Attorney, Agent, or Firm*—Michael S. Yatsko

[57] ABSTRACT

A novel IC chip packaging construction in which the chip package materials are selected such that their thermal linear expansion curves are closely matched over the full operating temperature range of the IC chip. The IC chip packaging construction includes a metal base and cover for enclosing the IC chip and a pair of insulating frames for hermetically sealing the IC chip in the chip package. A plurality of input/output leads make electrical connections with the IC chip through fine wires that are soldered to the leads and to contact areas on the IC chip. The metal base and cover and the input/output leads are fabricated from copper and the insulating frames are fabricated from Fotoceram® 160, which has a thermal linear expansion curve that closely matches that of copper over the full operating temperature range of the chip. Accordingly, the problems of differential expansion rates due to temperature variations for wafer size or very large scale IC chips are greatly minimized.

15 Claims, 2 Drawing Sheets

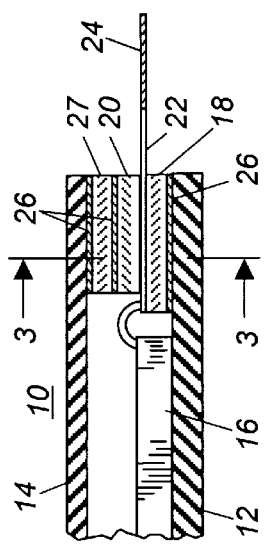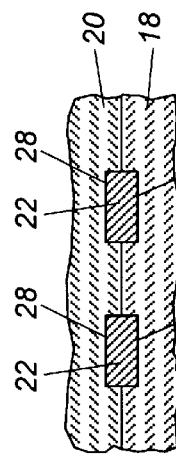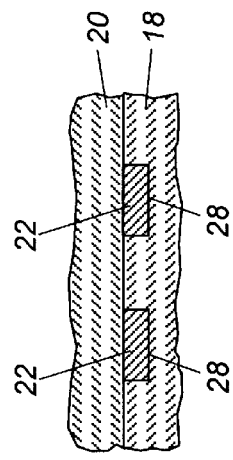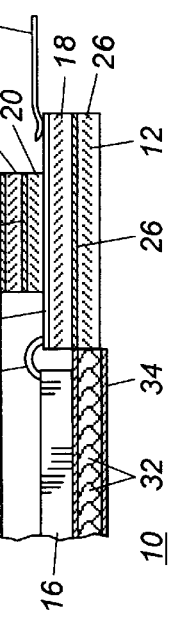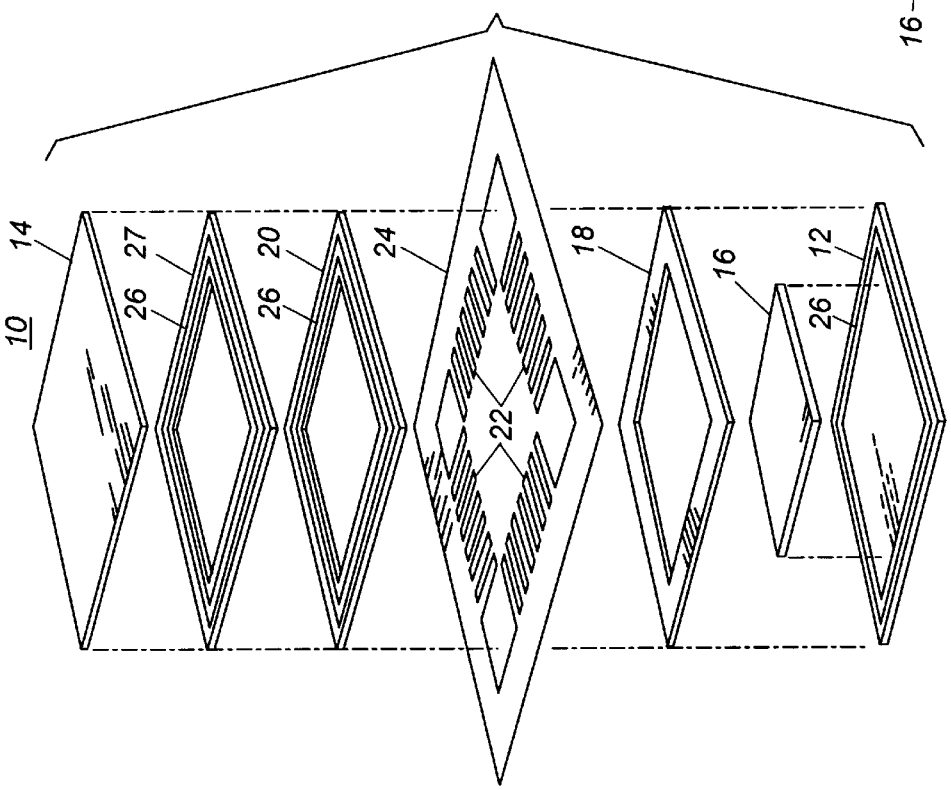

5,977,627

PACKAGING CONSTRUCTION FOR VERY LARGE SCALE INTEGRATED-CIRCUIT CHIPS

This application is a continuation-in-part of a copending application by the same inventor entitled "Integrated-Circuit Chip Packaging Construction," having Ser. No. 06/944,124, and filed on Dec. 22, 1986 now abandoned.

BACKGROUND OF THE INVENTION

This invention relates generally to techniques for packaging integrated-circuit (IC) chips and, more particularly, to techniques for packaging wafer size or very large scale IC chips.

Conventional integrated-circuit (IC) chip packaging techniques involve hermetically sealing IC chips in individual chip packages to protect the chips from the environment. The chip packages are generally fabricated from a ceramic material, such as alumina ($Al_2O_3$) or beryllia (BeO), or from a metal, such as copper. However, ceramic materials have relatively low thermal conductivities when compared with metals and are generally unsuitable for packaging wafer size or very large scale IC chips. This is because these chips draw large amounts of current and generate considerable amounts of heat that must be dissipated through the chip package. The use of ceramic materials for packaging these chips would either cause the chips to operate at excessively high temperatures or severely limit the density of the circuit elements that could be formed on the chips.

In contrast, metals have relatively high thermal conductivities and are quite suitable for packaging large scale IC chips. Conventional metal chip packages, such as the chip package disclosed in U.S. Pat. No. 4,524,238 to Butt, have a metal base, to which an IC chip is bonded, and a metal cover. The chip is hermetically sealed in the metal package by a solder glass or ceramic material having a coefficient of thermal expansion (CTE) that closely matches that of the metal base and cover. The coefficients of thermal expansion are matched to prevent any cracking of the solder glass or ceramic material due to temperature variations that occur during operation of the chip. Several solder glass materials, which have coefficients of thermal expansion in the range of approximately 160 to $170 \times 10^{-7}/°C.$, are suggested in the Butt patent for use in a copper or copper alloy chip package. Copper has a coefficient of thermal expansion of approximately $165 \times 10^{-7}/°C.$, from 0 to 100° C.

However, as IC chips become very large and approach the size of a semiconductor wafer, in the range of 5 to 6 inches, differences in the thermal linear expansion curves of the copper and solder glass materials over the full operating temperature range of the chip become extremely critical. A thermal linear expansion curve is to be compared with a coefficient of thermal expansion which is the slope of the expansion curve at a specified temperature, such as room temperature (25° C.). Even very small differences in the thermal expansions of these materials at some temperatures can cause cracking of a large scale chip package, resulting in the chip being ruined. The solder glass materials listed in the Butt patent generally do not have thermal linear expansion curves that closely match the thermal expansion curve of copper over the full operating temperature range of the chip. Accordingly, there has been a need for an improved packaging material for use with wafer size or large scale IC chips. The present invention is directed toward this end.

SUMMARY OF THE INVENTION

The present invention resides in a novel IC chip packaging construction in which the chip package materials are selected such that their thermal linear expansion curves are closely matched over the full operating temperature range of the IC chip. The IC chip packaging construction includes a metal base and cover for enclosing an IC chip and a pair of insulating frames for hermetically sealing the IC chip in the chip package. A plurality of input/output leads make electrical connections with the IC chip through fine wires that are soldered to the leads and to contact areas on the IC chip. The insulating frames support and insulate the input/output leads, while hermetically sealing the chip package.

In one preferred embodiment of the invention, the metal base and cover and the input/output leads are fabricated from copper and the insulating frames are fabricated from an insulating material having a thermal linear expansion curve that closely matches that of copper over the full operating temperature range of the chip. This insulating material, which is manufactured by the Corning Glass Works, Corning, N.Y., and marketed under the trademark Fotoceram®, is disclosed in U.S. Pat. No. 4,480,044 to McAlinn. The insulating material disclosed by this patent has an adjustable coefficient of expansion ranging from approximately 120 to $160 \times 10^{-7}/°$ C., depending on the intensity and time of exposure of a precursor glass composition to ultraviolet radiation and the temperature and time of subsequent heat treatments to the radiated precursor glass composition. The precursor glass composition is disclosed in U.S. Pat. No. 2,971,853 and is also manufactured by the Corning Glass Works, Corning, N.Y.

In order to closely match the thermal linear expansion curve of copper, the intensity and time of exposure of the precursor glass composition to ultraviolet radiation and the temperature and time of subsequent heat treatments to the radiated precursor glass composition is such that the Fotoceram® has a coefficient of thermal expansion (CTE) of approximately $160 \times 10^{-7}/°$ C. The thermal linear expansion curve of this material, called Fotoceram® 160 because of its CTE, is very closely matched to the thermal expansion curve of copper over the operating temperature range of 0° C. to 300° C. Accordingly, the problems of differential expansion rates due to temperature variations for wafer size or very large scale IC chips are greatly minimized.

It will be appreciated from the foregoing that the present invention represents a significant advance over conventional IC chip packaging techniques. Other features and advantages of the present invention will become apparent from the following more detailed description, taken in conjunction with the accompanying drawings, which illustrate, by way of example, the principles of the invention.

BRIEF DESCRIPTION OF THE DRAWINGS

FIG. 1 is an exploded perspective view of an IC chip packaging construction utilizing the techniques of the present invention;

FIG. 2 is a fragmentary sectional view of one disclosed embodiment of the IC chip packaging construction;

FIGS. 3A–3B are enlarged fragmentary sectional views taken substantially along the line 3—3 of FIG. 2;

FIG. 4 is a fragmentary sectional view of another disclosed embodiment of the IC chip packaging construction.

DESCRIPTION OF THE PREFERRED EMBODIMENTS

Figure 5:
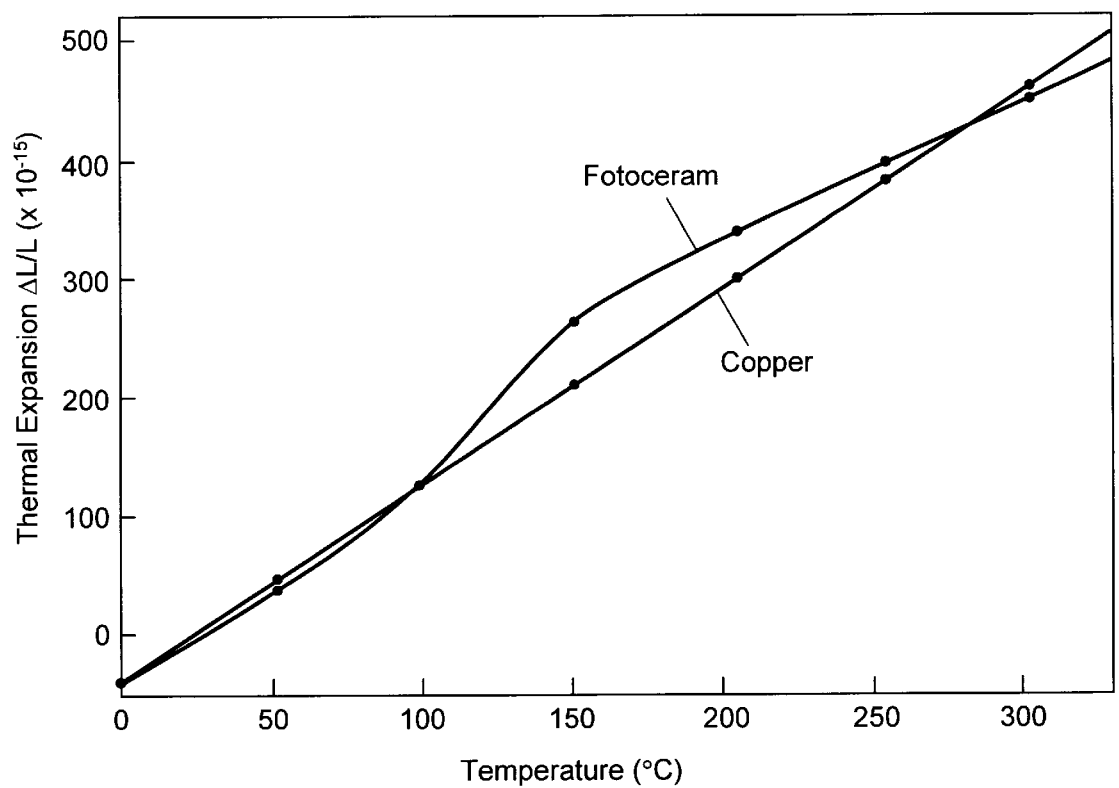
FIG. 5 shows the thermal linear expansion curves of copper and Fotoceram® 160.

As shown in the drawings for purposes of illustration, the present invention is embodied in a novel IC chip packaging construction in which the chip package materials are selected such that their thermal linear expansion curves are closely matched over the full operating temperature range of the IC chip. Conventional integrated-circuit (IC) chip packaging techniques utilize chip packages that are fabricated from a metal, such as copper. The chip is hermetically sealed in the metal package by a solder glass or ceramic material having a coefficient of thermal expansion (CTE) that closely matches that of the metal package. The coefficients of thermal expansion are matched to prevent any cracking of the solder glass or ceramic material due to temperature variations that occur during operation of the chip. However, as IC chips become very large and approach the size of a semiconductor wafer, in the range of 5 to 6 inches, differences in the thermal linear expansion curves of the copper and solder glass materials over the full operating temperature range of the chip become extremely critical. Even very small differences in the thermal expansions of these materials at some temperature can cause cracking of a large scale chip package, resulting in the chip being ruined.

FIGS. 1 and 2 illustrate one preferred embodiment of an IC chip packaging construction 10 in accordance with the present invention. The IC chip packaging construction 10 includes a metal base 12 and a metal cover 14 for enclosing an IC chip 16 and a pair of insulating frames 18, 20 for hermetically sealing the IC chip 16 in the chip package. A plurality of input/output leads 22 make electrical connections with the IC chip 16 through fine wires 23 that are soldered to the leads 22 and to contact areas on the IC chip 16. The insulating frames 18, 20 support and insulate the input/output leads 22, while hermetically sealing the chip package.

In this preferred embodiment of the invention, the metal base 12, metal cover 14 and input/output leads 22 are fabricated from copper and the insulating frames 18, 20 are fabricated from an insulating material having a thermal linear expansion curve that closely matches that of copper over the full operating temperature range of the chip 16. This insulating material, which is manufactured by the Corning Glass Works, Corning, N.Y., and marketed under the trademark Fotoceram®, is disclosed in U.S. Pat. No. 4,480,044 to McAlinn, which is incorporated herein by reference. The insulating material disclosed by this patent has an adjustable coefficient of expansion ranging from approximately 120 to 160 $\times 10^{-7}$/° C., depending on the intensity and time of exposure of a precursor glass composition to ultraviolet radiation and the temperature and time of subsequent heat treatments to the radiated precursor glass composition. The precursor glass composition is disclosed in U.S. Pat. No. 2,971,853 and is also manufactured by the Corning Glass Works, Corning, N.Y.

In order to closely match the thermal linear expansion curve of copper, the intensity and time of exposure of the precursor glass composition to ultraviolet radiation and the temperature and time of subsequent heat treatments to the radiated precursor glass composition is such that the Fotoceram® has a coefficient of thermal expansion (CTE) of approximately $160 \times 10^{-7}$/° C. The thermal linear expansion curve of this material, called Fotoceram® 160 because of its CTE, is shown in FIG. 5 along with the thermal expansion curve of copper. As can be seen, the expansion curves of these two materials are very closely matched from 0° C. to 300° C. Accordingly, the problems of differential expansion rates due to temperature variations for wafer size or very large scale IC chips are greatly minimized.

The chip packaging construction 10 of the present invention is assembled by first sandwiching the input/output leads 22 between the two insulating frames 18, 20. The input/output leads 22 may be fabricated as an integral part of a metal frame 24, which provides support and alignment for the leads 22 during this part of the assembly, but is later cut away. Alternatively, the input/output leads can be formed by thick-film deposition techniques on one of the insulating frames 18, 20, as shown in FIG. 4 and explained in greater detail below. The insulating frame 18 is then brazed to the metal base 12 with a brazing material 26, such as gold germanium, at a temperature not to exceed approximately 700° C. The insulating frame 20 is brazed to an attachment frame 27, also with brazing material 26. The IC chip 16 is then placed in the partially assembled package and the wires 23 are soldered between the input/output leads 22 and the chip contact areas. The metal cover 14 is placed over the partially assembled package and brazed to the attachment frame 27 with a somewhat lower temperature brazing material 26, at a temperature not to exceed approximately 300° C.

As shown in FIGS. 3A and 3B, in the one preferred embodiment of the invention, the input/output leads 22 extend from the wires 23 to the exterior of the chip package through outwardly extending openings 28 in one or both of the insulating frames 18, 20. In another preferred embodiment of the invention, as shows in FIG. 4, the input/output leads include copper traces 30 that are deposited by conventional thick-film techniques on one of the insulating frames and input/output leads 22' that are soldered to the outer ends the thick-film traces 30.

In still another preferred embodiment of the invention, also as shown in FIG. 4, an IC chip packaging construction 10' includes a metal cover 14' and a composite base 12' fabricated from Fotoceram® 160 having a plurality of through-holes 32 filled with copper 34. The composite cover is lighter, has a more level surface and is less costly than the all metal cover.

From the foregoing, it will be appreciates that the present invention represents a significant advance over conventional IC chip packaging techniques. Although several preferred embodiments of the invention have been shown and described, it will be apparent that other adaptations and modifications can be made without departing from the spirit and scope of the invention. Accordingly, the invention is not to be limited, except as by the following claims.

I claim:

1. An integrated-circuit (IC) chip package, comprising:
   a metal base and cover for enclosing an IC chip;
   an insulating frame interposed between the metal base and cover for hermetically sealing the IC chip in the chip package, the insulating frame having a plurality of outwardly extending openings; and
   a plurality of input/output leads extending through the openings in the insulating frame for making electrical connections with the IC chip;
   wherein the thermal linear expansion curves of the metal base and cover and the insulating frame are closely matched over the full operating temperature range of the IC chip.

2. The chip package as set forth in claim 1, wherein the metal base and cover are fabricated from copper and the insulating frame is fabricated from Fotoceram® 160.

3. The chip package as set forth in claim 2, wherein the plurality of input/output leads are fabricated from copper.

4. The chip package as set forth in claim 1, wherein the insulating frame includes two insulating frames with the plurality of input/output leads interposed between the insulating frames.

5. The chip package as set forth in claim 4, wherein the plurality of input/output leads include metal traces deposited on one of the insulating frames.

6. The chip package as set forth in claim 5, wherein the metal traces are fabricated from copper.

7. The chip package as set forth in claim 1, wherein the metal base is fabricated from an insulating material having a plurality of through-holes filled with a metal.

8. The chip package as set forth in claim 7, wherein the insulating material is Fotoceram® 160 and the through-holes are filled with copper.

9. A method for constructing an integrated-circuit (IC) chip package, comprising the steps of:

enclosing an IC chip in a chip package fabricated from a metal, the chip package having a base and a cover;

hermetically sealing the chip package with an insulating frame interposed between the metal base and cover, the insulating frame having a plurality of outwardly extending openings; and electrically connecting the IC chip with a plurality of input/output leads, the input/output leads extending through the openings in the insulating frame;

wherein the thermal linear expansion curves of the metal base and cover and the insulating frame are closely matched over the full operating temperature range of the IC chip.

10. The method as set forth in claim 9, wherein the metal base and cover are fabricated from copper and the insulating frame is fabricated from Fotoceram® 160.

11. The method as set forth in claim 10, wherein the plurality of input/output leads are fabricated from copper.

12. The method as set forth in claim 9, wherein the step of sealing the chip package includes the steps of:

positioning the plurality of input/output leads in the openings in the insulating frame, the input/output leads being attached to the inside edges of a metal frame;

sealing the chip package with the insulating frame; and cutting away the metal frame.

13. An integrated-circuit (IC) chip packages comprising:

a base and cover for enclosing an IC chip;

an insulating frame interposed between the base and cover for sealing the IC chip in the chip package, the insulating frame having a plurality of outwardly extending openings; and a plurality of input/output leads extending through the openings in the insulating frame for making electrical connections with the IC chip;

wherein the thermal linear expansion curves of the base, cover and insulating frame are closely matched over the full operating temperature range of the IC chip.

14. The chip package as set forth in claim 13, wherein the base and cover are fabricated from copper and the insulating frame is fabricated from Fotoceram® 160.

15. The chip package as set forth in claim 14, wherein the plurality of input/output leads are fabricated from copper.

* * * * *